(12) United States Patent
He et al.

(10) Patent No.: US 8,908,445 B2
(45) Date of Patent: Dec. 9, 2014

(54) NON-VOLATILE MEMORY (NVM) WITH BLOCK-SIZE-AWARE PROGRAM/ERASE

(71) Applicants: Chen He, Austin, TX (US); Yanzhuo Wang, Austin, TX (US)

(72) Inventors: Chen He, Austin, TX (US); Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/837,652

(22) Filed: Mar. 15, 2013

(65) Prior Publication Data

US 2014/0269111 A1 Sep. 18, 2014

(51) Int. Cl.
*G11C 7/00* (2006.01)
*G11C 16/08* (2006.01)
*G11C 8/08* (2006.01)
*G11C 7/22* (2006.01)

(52) U.S. Cl.
CPC ...... *G11C 7/00* (2013.01); *G11C 16/08* (2013.01); *G11C 8/08* (2013.01); *G11C 7/22* (2013.01)
USPC ........... 365/189.011; 365/185.11; 365/185.23

(58) Field of Classification Search
None
See application file for complete search history.

(56) References Cited

U.S. PATENT DOCUMENTS

| | | | |
|---|---|---|---|
| 6,643,181 B2 * | 11/2003 | Sofer et al. | 365/185.22 |
| 7,009,882 B2 | 3/2006 | Chen | |
| 7,136,304 B2 | 11/2006 | Cohen et al. | |
| 7,173,859 B2 | 2/2007 | Hemink | |
| 2007/0222498 A1 * | 9/2007 | Choy et al. | 327/536 |
| 2010/0110815 A1 * | 5/2010 | Lee et al. | 365/211 |
| 2011/0205801 A1 * | 8/2011 | Shiga | 365/185.18 |
| 2011/0267893 A1 | 11/2011 | Kato et al. | |
| 2012/0327720 A1 * | 12/2012 | Eguchi et al. | 365/185.29 |

* cited by examiner

*Primary Examiner* — Gene Auduong
(74) *Attorney, Agent, or Firm* — James L. Clingan, Jr.; Joanna G. Chiu

(57) ABSTRACT

A memory includes a plurality of blocks in which each block includes a plurality of memory cells. The memory includes a set of charge pumps which apply voltages to the plurality of blocks. A method includes selecting a block of the plurality of memory blocks; determining an array size of the selected block; determining a set of program/erase voltages based on the array size and temperature from a temperature sensor; and programming/erasing the selected block, wherein the set of program/erase voltages are applied by the set of charge pumps during the programming/erasing of the selected block.

20 Claims, 3 Drawing Sheets

NON-VOLATILE MEMORY (NVM) WITH BLOCK-SIZE-AWARE PROGRAM/ERASE

BACKGROUND

1. Field of the Disclosure

This disclosure relates generally to non-volatile memories (NVMs), and more specifically, to NVMs that include block-size-aware program/erase operations.

2. Description of the Related Art

Typical non-volatile memories (NVMs) use charge pumps for generating program/erase voltages to apply to the memory cells during program and erase operations. The voltages selected for program and erase operations are based on desirable characteristics for the threshold voltage distribution and the program and erase performance of the cells that are programmed or erased. For a given NVM, there is a determined charge pump voltage for program and erase for each relevant node. For erase this is typically the gate voltage and the well voltage. For programming this is typically the gate voltage and the drain voltage. Due to the possible voltage drop caused by the leakage current between the charge pumps and the memory cells, the intended charge pump voltage may not be delivered to memory cells. NVM typically consists of blocks with different array sizes, i.e., number of memory cells. The leakage current will be different for different block sizes and will thereby result in different program and erase biases applied to the memory cells even with the same charge pump voltage setting. This will in turn result in different program/erase performance and threshold voltage distributions after the program and erase operation on blocks with different block sizes. If the magnitudes of the biases to the memory cells are too high, the extent of the programming or erase is larger than necessary and eventually impacts endurance. On the other hand, if the magnitudes of the biases to the memory cells are too low, the time required to perform the program or erase is longer than necessary. Moreover, the variation of the threshold voltage range of the bit cells for different block sizes will likely cause different data retention characteristics for different block sizes. Thus, the charge pump voltage conditions for program or erase of NVM blocks of different sizes to ensure consistent biases seen by memory cells and hence ensure consistent program/erase performance and reliability bear on the life of the memory and program/erase time. In addition, temperature will also impact the leakage current. Typically leakage current will be higher at a higher temperature. Thus, temperature will also need to be taken into consideration when choosing charge pump voltages conditions.

Thus there is a need for program/erase operations that improve upon one or more the issues raised above.

BRIEF DESCRIPTION OF THE DRAWINGS

The benefits, features, and advantages of the present disclosure will become better understood with regard to the following description, and accompanying drawings where.

DETAILED DESCRIPTION

In one aspect a non-volatile memory has blocks in which a program/erase operation on a selected block uses charge pump voltages determined based on the size of the selected block. Temperature may also be used in the determination of the charge pump voltages. This is better understood by reference to the drawings and the following written description.

Figure 1:
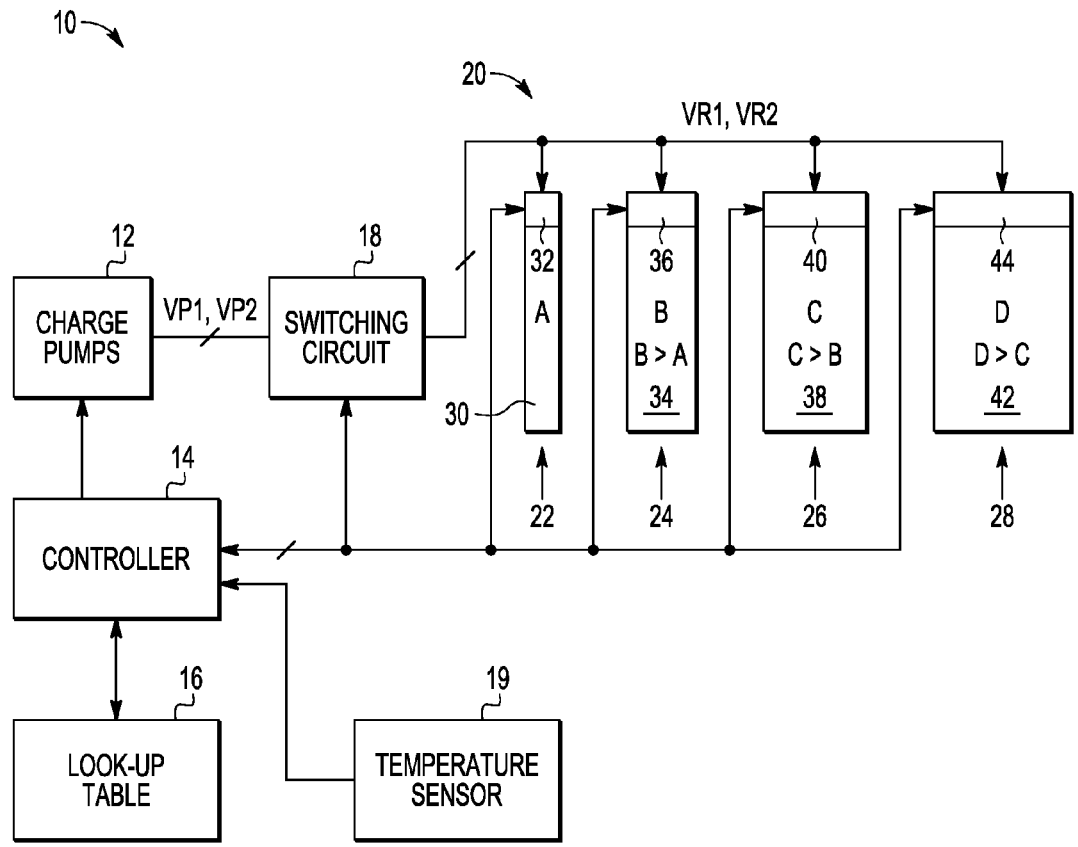
FIG. 1 is a block diagram of a non-volatile memory (NVM) according to an embodiment.

Shown in FIG. 1 is a non-volatile memory (NVM) 10 having a set of charge pumps 12, a memory controller 14 coupled to charge pumps 12, a look-up table 16 coupled to controller 14, switching circuitry 18 coupled to charge pump 12 and controller 14, a temperature sensor 19 coupled to controller 14, and an NVM structure 20 coupled to switching circuitry 18 and controller 14. NVM structure 20 has a block 22, a block 24, a block 26, and a block 28. Block 22 has a block array 30 and access circuitry 32 coupled to controller 14 and switching circuitry 18. Block 24 has a block array 34 and access circuitry 36 coupled to controller 14 and switching circuitry 18. Block 26 has a block array 38 and access circuitry 40 coupled to controller 14 and switching circuitry 18. Block 28 has a block array 42 and access circuitry 44 coupled to controller 14 and switching circuitry 18. The access circuitry typically contains row decoders, column decodes, and sense amplifiers (not shown in the figure) that are used to access the NVM block array. Controller 14 controls the operations of NVM structure 20 including reading, programming, and erasing. Block array 30 has a size A, which may be, for example, 16 kilobytes (KB). Block array 34 has a size B, which may be, for example, 32 KB. Block array 38 has a size C, which may be, for example, 64 KB. NVM array 42 has a size D, which may be, for example, 256 KB. Thus, size B is greater than size A; size C is greater than size B; and size D is greater than size C. Shown as outputs of charge pumps 12 are pump voltages VP1 and VP2 as supplied from charge pumps 12 and the resulting voltages VR1 and VR2 due to voltage drop across switching circuitry 18 due to leakage current drawn from a selected block among blocks 22, 24, 26, and 28. The leakage varies with size so that the difference between VP1 and VR1, for example, depends on the size of the selected block.

Figure 2:
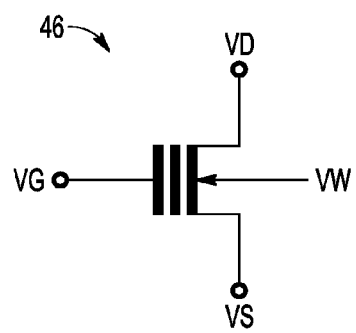
FIG. 2 is a circuit diagram of an NVM cell that is representative of one of the NVM cells of the NVM of FIG. 1 and is itself according to a design of the prior art.

Shown in FIG. 2 is an NVM cell 46 that is representative of one of the memory cells of block arrays 30, 34, 36, and 38. NVM cell 46 has a gate node on which a gate voltage VG will be applied, a drain node on which a drain voltage VD will be applied, a source node on which a source voltage VS will be applied, and a well node on which a well voltage VW will be applied. For a read operation, for example, a voltage of 4.2 volts from charge pumps 12 may be applied to VG through switching circuitry 18 and access circuitry 32, 36, 40, or 44 for the selected block, a voltage of 0.5 volt may be applied as voltage VD, and ground may be applied as voltage VS and voltage VW. Sensing is relative to what is the memory cell current at the gate voltage VG during the read. For an erase, voltage is supplied from charge pumps 12 to the gate and well voltages, VG and VW, nominally at −8.5 volts and 8.5 volts, respectively, through switching circuitry 18 and access circuitry 32, 36, 40, or 44 for the selected block. In some NVM technologies, the charge pumps voltages applied to VG or VW may ramp after each erase pulse, from a lower magnitude, for example −4 volts for VG or 4 volts for VW, to the peak voltage at −8.5 volts for VG or 8.5 volts for VW, for better reliability. Voltages VD and VS are floating. For a program, charge pumps 12 nominally may supply 8.5 volts to VG and 4.2 volts to VD through switching circuitry 18 and access circuitry 32, 36, 40, or 44 for the selected block. Voltage VS may be ground, and voltage VW may be ground. For program and erase these are starting points from which voltages to be supplied by charge pumps 12. Although in the present example, the voltages supplied by charge pumps 12, including the ramp start and end voltages for ramped erase, are not changed during a particular program or erase cycle that does not preclude the possibility of doing so. In such case the particular program and erase charge pump voltages are selected based on what is found to be the optimum conditions for erasing and programming may initiate the program and erase and changes from that may then occur.

Figure 3:
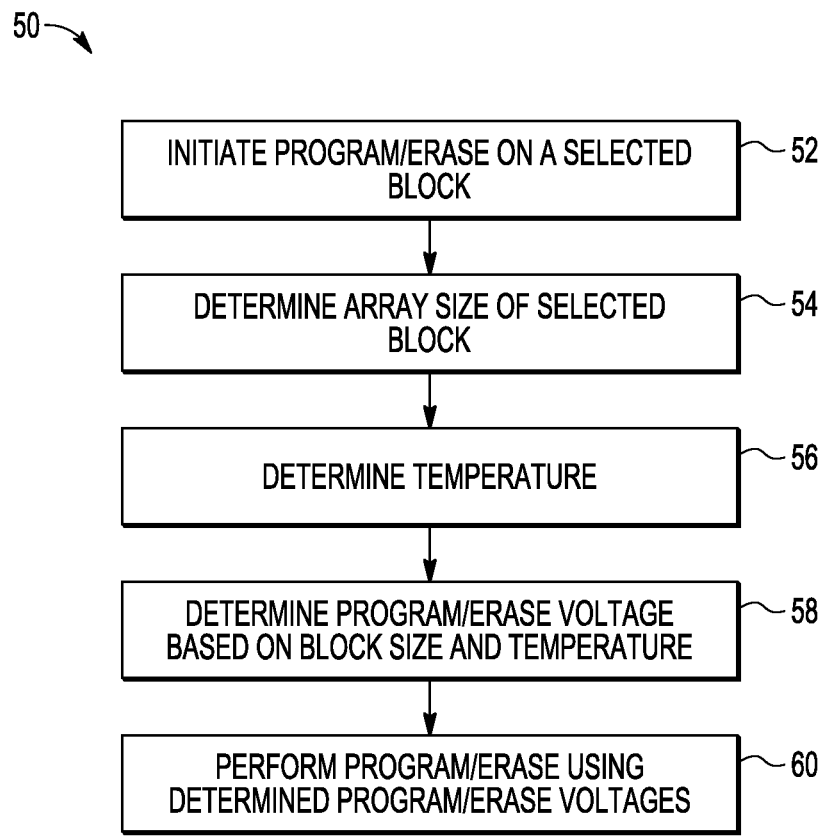
FIG. 3 is a flowchart diagram of a program/erase operation on the NVM of FIG. 1.

. Shown in FIG. 3 is a flowchart 50 having steps 52, 54, 56, 58, and 60 showing a program/erase methodology operated by controller 14 that applies voltages from charge pumps 12 through switching circuitry 18 that are generated to a magnitude based on the size of the block array that is being programmed or erased and on the operating temperature. At step 52, a program/erase operation is initiated on a selected block. At step 54, the size of the selected block is determined. For example, if block array 34 is selected, then the array size would be size B, which may be 32 KB. At step 56, the temperature is determined using temperature sensor 19. At step 58, the charge pump voltages to be applied to the NVM cells, at least initially, are determined based on the block size and temperature. In this example, this is performed using look-up table 16. The entries in look-up table may be obtained during production test using the methodology shown in FIG. 4. At step 60, the program or erase is then performed using the determined voltages. The determined voltages are generated by charge pumps 12 as directed by controller 14. The result is that the desired voltages VG, VD, VS, and VW are applied to the actual NVM cells in the selected block regardless of the size of the block array.

The size of the block array affects the drop in magnitude of the voltages provided by charge pump 12. The greater the size of the array the greater the leakage current from the array. With greater leakage current there is more voltage drop for the voltages before reaching the NVM cells of the selected block. Switching circuitry 18, for example, drops more voltage with an increase in leakage current from the array thereby reducing the voltage received by the block array. Thus for a given voltage being supplied by charge pumps 12, the voltage received by the memory cells of block array 30 will be greater than that received by block array 34; the voltage received by a memory cell of block array 34 will be greater than that received by block array 38; and the voltage received by a memory cell of block array 38 will be greater than that received by block array 42. In addition, the higher the temperature, the greater the leakage current from the array. Thus, temperature also affects the desired voltage for performing program and erase and thus is included in the determination of the voltage levels supplied by charge pumps 12. For a given temperature, the charge pump voltages for program and erase vary based on the size of the block array being programmed or erased. As a result, consistent biases will be delivered to the actual memory cells and hence ensure consistent program/erase performance and reliability for NVM blocks of different sizes and at different temperatures.

. The actual magnitudes of the voltages at the NVM cell nodes within a block array are very difficult to measure and not realistic to do so in a production device. The technique used to obtain the voltage levels to be provided by charge pump 12 for a given block array may be obtained experimentally. This is achieved by measuring the effect of a programming or erase operation compared to the desired effect.

Figure 4:
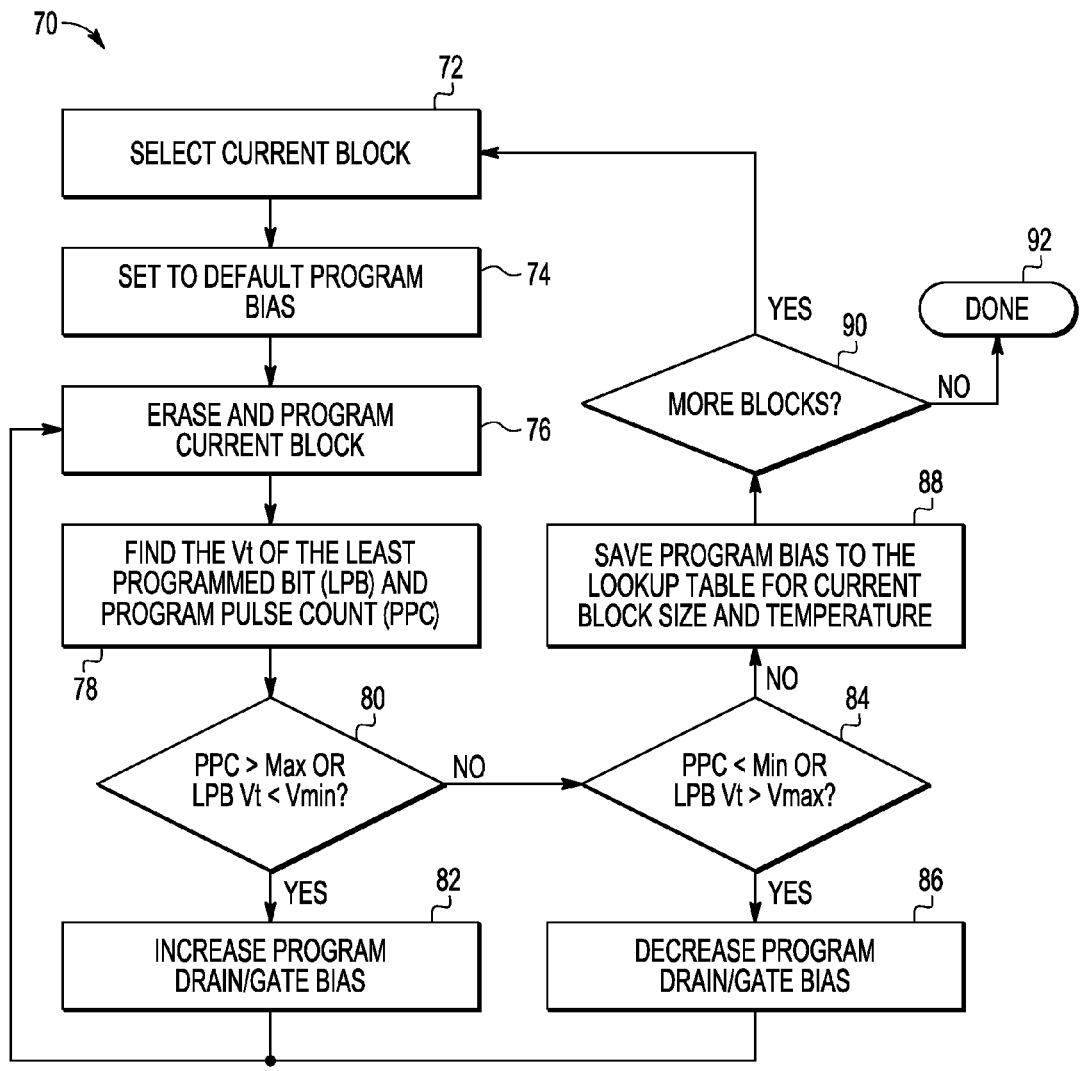
FIG. 4 is a flowchart for determining charge pump voltages used in the program/erase operation of FIG. 3.

Shown in FIG. 4 is a flowchart 70 showing a method for obtaining the desired charge pump voltages for programming for a given block array. A similar process may be used for obtaining the desired charge pump voltages for erasing. At step 72 a block is selected. At step 74, a default charge pump bias is selected for the program and erase voltages. At step 76 the selected block is first erased and then programmed. At step 78, the threshold voltage (Vt) of the least programmed bit is determined as well as the number of program pulses used. A program operation includes up to a maximum number of pulses in order to move the Vt of all the NVM cells in the block above a program verify level (e.g., 6 volts). The memory cell in the programmed block with the lowest Vt is called the least programmed bit (LPB), which can be used as an indication to the strength of the program bias. At step 80 a determination is made if the Vt of the least programmed bit is less than the minimum acceptable Vt shown as Vmin, and also a determination is made if the program pulse count has exceeded an acceptable maximum shown as MAX. If either is true, which indicates the program bias seen at the memory cells is too low, then at step 82 the program voltages for the drain or gate are incremented in charge pumps 12 and steps 76, 78, and 80 are repeated with the incremented voltages. Typically adjusting the drain voltage has more effect on compensating the leakage current from the memory block array than the gate voltage. If neither is true, then at step 84 a determination is made if the program pulse count is below an acceptable minimum shown as Min or if the Vt of the least programmed bit is greater than a maximum acceptable Vt shown as Vmax. If either is true, which indicates the program bias seen at the memory cells is too high, at step 86 the drain or gate voltages as supplied at charge pumps 12 are decremented, and steps 76, 78, and 80 are repeated. If neither is true, which indicates the program bias seen at the memory cells is proper, at step 88 the most recently used drain and gate voltages, as supplied by charge pumps 12, are stored in the look-up table for that particular block for the temperature that the memory was being programmed at. This then becomes the drain and gate voltage, as supplied by charge pump 12, used when programming is performed on that block at that temperature. At step 90, a determination is made if there are more blocks needing to be tested for the desired gate and drain voltage to be supplied by charge pump 12. If yes, then another block is selected at step 72 and method 70 is continued until all of the blocks are tested and their results recorded in look-up table 16. After all of the blocks have been tested and results recorded, the process continues at another temperature. All of the blocks are then tested and results recorded in look-up table 16 until all of the blocks have been tested and results recorded for each test temperature. Three test temperatures, at hot (125 C), cold (−40 C), and room (25 C), may be sufficient.

Table 1 below is an example look-up table for program drain charge pump voltages obtained by the flow described in FIG. 4 at three temperatures for an example NVM technology.

TABLE 1

Example Look-up Table for
Program Drain Charge Pump Voltages (Volts)

|  | 16 KB | 32 KB | 64 KB | 256 KB |
| --- | --- | --- | --- | --- |
| Hot | 4.2 | 4.3 | 4.4 | 4.6 |
| Room | 4.1 | 4.2 | 4.3 | 4.5 |
| Cold | 4.0 | 4.1 | 4.2 | 4.4 |

Thus it is seen that program and erase voltages supplied by a charge pump can adjusted based on the array block size and temperature to better provide optimized programming and erase across a variety of block sizes and temperatures.

By now it should be appreciated that a method for programming/erasing a memory, the memory comprising a plurality of blocks, each block comprising a plurality of memory cells, and a set of charge pumps which apply voltages to the plurality of blocks has been disclosed. The method includes selecting a block of the plurality of blocks. The method further includes determining an array size of the selected block. The method further includes determining a set of program/erase voltages based on the array size. The method further includes programming/erasing the selected block, wherein the set of program/erase voltages are applied by the set of charge pumps during the programming/erasing of the selected block. The method may have a further characterization by which the set of program/erase voltages has a first set of values when the array size is a first size and a second set of values when the array size is a second size, different than the first size. The method may have a further characterization by which the determining the set of program/erase voltages includes determining at least one of a drain voltage, a well voltage, a gate voltage, and a source voltage to be applied by a corresponding charge pump of the set of charge pumps. The method may further include determining a temperature of the memory, wherein the determining the set of program/erase voltages is based on the array size and the temperature. The method may have a further characterization by which the determining the set of program/erase voltages includes accessing storage circuitry which stores sets of program/erase voltages corresponding to different array sizes at different temperatures. The method may have a further characterization by which the determining the set of program/erase voltages includes calculating the set of program/erase voltages using the array size and the temperature. The method may have a further characterization by which the determining the set of program/erase voltages includes accessing storage circuitry which stores sets of program/erase voltages corresponding to different array sizes. The method may have a further characterization by which the programming/erasing the selected block includes controlling the set of charge pumps to provide the set of program/erase voltages during the programming/erasing of the selected block. The method may have a further characterization by which the determining the set of program/erase voltages includes calculating the set of program/erase voltages using the array size. The method may have a further characterization by which the programming/erasing the selected block includes applying the set of program/erase voltages for a plurality of program/erase pulses. The method may have a further characterization by which the determined set of program/erase voltages results in the number of program/erase pulses required to program/erase the selected block being within a predetermined range. The method may have a further characterization by which the determined set of program/erase voltages results in threshold voltages of the memory cells within the selected block being within a predetermined range after the programming/erasing of the selected block.

Also disclosed is a memory including a plurality of blocks, each block comprising a plurality of memory cells. The memory further includes a set of charge pumps coupled to provide program/erase voltages to the plurality of blocks. The memory further includes a memory controller, wherein the memory controller selects a block of the plurality of blocks for programming/erasing and, based on an array size of the selected block, determines a set of program/erase voltages to be provided by the set of charge pumps to the selected block during the programming/erasing of the selected block. The memory may further include a temperature sensor coupled to the memory controller, wherein the memory controller determines the set of program/erase voltages based on the array size and a temperature provided by the temperature sensor. The memory may further include storage circuitry which stores sets of program/erase voltages corresponding to different array sizes, wherein the memory controller accesses the storage circuitry to determine the set of program/erase voltages. The memory may further include storage circuitry which stores sets of program/erase voltages corresponding to different array sizes at different temperatures, wherein the memory controller accesses the storage circuitry to determine the set of program/erase voltages. The memory may have a further characterization by which the memory controller determines at least one of a drain voltage, a well voltage, a gate voltage, and a source voltage to be applied by a corresponding charge pump of the set of charge pumps as part of the set of program/erase voltages.

Disclosed also is a method for programming/erasing a memory, the memory comprising a plurality of blocks, each block comprising a plurality of memory cells, and a set of charge pumps which apply voltages to the plurality of blocks. The method includes selecting a block of the plurality of memory blocks. The method further includes determining an array size of the selected block. The method further includes determining a temperature of the memory. The method further includes determining a set of program/erase voltages based on the array size and the temperature. The method further includes programming/erasing the selected block, wherein the set of program/erase voltages are applied by the set of charge pumps during the programming/erasing of the selected block. The method may have a further characterization by which the set of program/erase voltages has a first set of values when the array size is a first size and a second set of values when the array size is a second size, different than the first size. The method may have a further characterization by which the determining the set of program/erase voltages includes determining at least one of a drain voltage, a well voltage, a gate voltage, and a source voltage to be applied by a corresponding charge pump of the set of charge pumps.

.Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. For example, other techniques for determining the charge pump voltages that go with particular arrays may be used. Those skilled in the art should appreciate that they can readily use the disclosed conception and specific embodiments as a basis for designing or modifying other structures for carrying out the same purposes of the present disclosure without departing from the spirit and scope of the disclosure as defined by the appended claims.

What is claimed is:

1. A method for programming/erasing a memory, the memory comprising a plurality of blocks, each block comprising a plurality of memory cells, and a set of charge pumps which apply voltages to the plurality of blocks, the method comprising:
    selecting a block of the plurality of blocks;
    determining an array size of the selected block, wherein the array size comprises a number of memory cells included in the selected block;
    determining a set of program/erase voltages based on the array size; and
    programming/erasing the selected block, wherein the set of program/erase voltages are applied by the set of charge pumps during the programming/erasing of the selected block.

2. The method of claim 1, wherein the set of program/erase voltages has a first set of values when the array size is a first size and a second set of values when the array size is a second size, different than the first size.

3. The method of claim 1, wherein the determining the set of program/erase voltages comprises:
    determining at least one of a drain voltage, a well voltage, a gate voltage, and a source voltage to be applied by a corresponding charge pump of the set of charge pumps.

4. The method of claim 1, further comprising:
    determining a temperature of the memory, wherein the determining the set of program/erase voltages is based on the array size and the temperature.

5. The method of claim 4, wherein the determining the set of program/erase voltages comprises:
    accessing storage circuitry which stores sets of program/erase voltages corresponding to different array sizes at different temperatures.

6. The method of claim 4, wherein the determining the set of program/erase voltages comprises:
    calculating the set of program/erase voltages using the array size and the temperature.

7. The method of claim 1, wherein the determining the set of program/erase voltages comprises:
    accessing storage circuitry which stores sets of program/erase voltages corresponding to different array sizes.

8. The method of claim 1, wherein the programming/erasing the selected block comprises:
    controlling the set of charge pumps to provide the set of program/erase voltages during the programming/erasing of the selected block.

9. The method of claim 1, wherein the determining the set of program/erase voltages comprises:
    calculating the set of program/erase voltages using the array size.

10. The method of claim 1, wherein the programming/erasing the selected block comprises:
    applying the set of program/erase voltages for a plurality of program/erase pulses.

11. The method of claim 1, wherein the determined set of program/erase voltages results in the number of program/erase pulses required to program/erase the selected block being within a predetermined range.

12. The method of claim 1, wherein the determined set of program/erase voltages results in threshold voltages of the memory cells within the selected block being within a predetermined range after the programming/erasing of the selected block.

13. A memory, comprising:
    a plurality of blocks, each block comprising a plurality of memory cells;
    a set of charge pumps coupled to provide program/erase voltages to the plurality of blocks; and
    a memory controller, wherein the memory controller selects a block of the plurality of blocks for programming/erasing and, based on an array size of the selected block, determines a set of program/erase voltages to be provided by the set of charge pumps to the selected block during the programming/erasing of the selected block, wherein the array size comprises a number of memory cells included in the selected block.

14. The memory of claim 13, further comprising:
    a temperature sensor coupled to the memory controller, wherein the memory controller determines the set of program/erase voltages based on the array size and a temperature provided by the temperature sensor.

15. The memory of claim 13, further comprising:
    storage circuitry which stores sets of program/erase voltages corresponding to different array sizes, wherein the memory controller accesses the storage circuitry to determine the set of program/erase voltages.

16. The memory of claim 13, further comprising:
    storage circuitry which stores sets of program/erase voltages corresponding to different array sizes at different temperatures, wherein the memory controller accesses the storage circuitry to determine the set of program/erase voltages.

17. The memory of claim 13, wherein the memory controller determines at least one of a drain voltage, a well voltage, a gate voltage, and a source voltage to be applied by a corresponding charge pump of the set of charge pumps as part of the set of program/erase voltages.

18. A method for programming/erasing a memory, the memory comprising a plurality of blocks, each block comprising a plurality of memory cells, and a set of charge pumps which apply voltages to the plurality of blocks, the method comprising:
    selecting a block of the plurality of memory blocks;
    determining an array size of the selected block, wherein the array size comprises a number of memory cells included in the selected block;
    determining a temperature of the memory;
    determining a set of program/erase voltages based on the array size and the temperature; and
    programming/erasing the selected block, wherein the set of program/erase voltages are applied by the set of charge pumps during the programming/erasing of the selected block.

19. The method of claim 18, wherein the set of program/erase voltages has a first set of values when the array size is a first size and a second set of values when the array size is a second size, different than the first size.

20. The method of claim 18, wherein the determining the set of program/erase voltages comprises:

determining at least one of a drain voltage, a well voltage, a gate voltage, and a source voltage to be applied by a corresponding charge pump of the set of charge pumps.

* * * * *